United States Patent [19]

Cohen-Solal et al.

[11] 4,013,533
[45] Mar. 22, 1977

[54] VOLATILIZATION AND DEPOSITION OF A SEMI-CONDUCTOR SUBSTANCE AND A METALLIC DOPING IMPURITY

[75] Inventors: Gerard Cohen-Solal, Chatenay; Alain Zozime, Saint-Denis; Claude Sella, Meudon La Foret, all of France

[73] Assignee: Agence Nationale de Valorisation de la Recherche (ANVAR), Neuilly sur Seine, France

[22] Filed: Mar. 25, 1975

[21] Appl. No.: 561,946

[30] Foreign Application Priority Data

Mar. 27, 1974 France .................... 74.10601

[52] U.S. Cl. .................. 204/192 S; 148/174; 204/298; 357/11; 357/30
[51] Int. Cl.² .................................. C23C 15/00
[58] Field of Search ............. 427/51, 85; 357/11, 357/30; 204/192, 298; 148/171, 174; 250/338, 341, 370

[56] References Cited

UNITED STATES PATENTS

| | | | |
|---|---|---|---|
| 3,261,726 | 7/1966 | Ruehrwein | 148/33.4 |
| 3,324,019 | 6/1967 | Laegreid et al. | 204/192 |
| 3,531,335 | 9/1970 | Heyerdahl et al. | 148/174 |
| 3,615,931 | 10/1971 | Arthur, Jr. | 148/175 |
| 3,716,424 | 2/1973 | Schoolar | 148/175 |
| 3,751,310 | 8/1973 | Cho | 148/175 |
| 3,765,940 | 10/1973 | Hentzschel | 427/85 X |
| 3,911,469 | 10/1975 | Wrobel | 357/30 |

FOREIGN PATENTS OR APPLICATIONS 4,749,987  12/1972  Japan .................... 204/192

OTHER PUBLICATIONS

E. L. Hollar et al., "Composite Film Metallizing for Ceramics," J. Electrochem. Soc., vol. 117, No. 11, pp. 1461–1462, (1970).
A. Zozime et al., "Sputtering of $Cd_xHg_{1-x}Te$ Films in Mercury Vapor Plasma," Thin Solid Films, vol. 13, No. 2, 373–378, (1972).
R. E. Jones et al., "Doping Technique for RF Sputtering," IBM Technical Disclosure Bulletin, vol. 9, No. 10, p. 1417, (Mar. 1967).

*Primary Examiner*—John H. Mack
*Assistant Examiner*—Aaron Weisstuch
*Attorney, Agent, or Firm*—Ostrolenk, Faber, Gerb & Soffen

[57] ABSTRACT

A method and apparatus for producing a thin semi-conductor coating on a substrate in a vacuum enclosure, by depositing on the substrate a semi-conductor substance volatilized by a plasma from a source in the enclosure and also depositing on the substrate a metallic doping impurity volatilized by the plasma from another source in the enclosure.

3 Claims, 4 Drawing Figures

VOLATILIZATION AND DEPOSITION OF A SEMI-CONDUCTOR SUBSTANCE AND A METALLIC DOPING IMPURITY

FIELD OF THE INVENTION

This invention relates to a method and apparatus for producing thin coatings of semi-conductive alloy doped with metallic impurities, for example for p-n or n-p junctions. The invention also includes the thin coatings or junctions produced and semi-conductive devices produced with the aid of such thin coatings or junctions, particularly those having a large active surface area, for example a surface area generally greater than 1 sq.mm. or even 1 sq.cm.

DESCRIPTION OF THE PRIOR ART

French Patent No. 1,447,257 discloses a method of producing thin coatings which are capable of occupying large surface areas, by deposition and epitaxial growth on a substrate disposed in an enclosure of even temperature, of a substance volatilised from a source or "target" in the enclosure.

SUMMARY OF THE INVENTION

An object of the invention is to provide an improvement of the known methods, and in particular to permit simpler and more viable large series production of the coatings which will be capable of exhibiting large surface areas and with good electrical and mechanical performance, particularly with regard to sensitivity for infra-red detection by a detector having such thin coating.

According to the invention a method of producing a semi-conductor coating doped with a metallic impurity comprises depositing on a substrate in a vacuum enclosure a semi-conductor substance volatilized from a source or target in the enclosure, and depositing on the substrate at least one metallic doping impurity volatilized from another source or target in the enclosure.

Also according to this invention there is provided apparatus for producing a thin semi-conductor coating doped with a metallic impurity comprising:- a vacuum enclosure; means for controlling the temperature of the enclosure; a substrate in the enclosure; means for heating or cooling the substrate; a main source or target of semi-conductor material disposed in the enclosure and at a negative potential and cooled; a means for creating an ionic plasma in the enclosure; at least one metallic auxiliary target in the enclosure; a second source or target of a doping impurity for the semi-conductor material; and means for applying to the second source or target a negative potential.

In preferred forms of embodiment, one or more than one of the following may be used:

the enclosure may contain two auxiliary sources or targets for providing the thin semi-conductive coating on the substrate respectively with doping atoms of two types of opposite polarities, and means for neutralising the effects of the two sources or targets on the doping;

the means of neutralising each source or target may comprise a mechanism for supporting the source or target so that it can be exposed to the ionic plasma or be shielded from the plasma, for example by disposing it within a screen at floating potential in the enclosure;

the two auxiliary sources or targets may be flat washers apertured in their centres and each mounted so as to surround the top of the main source or target at least while it is in use for doping;

the deposition of thin doped coatings may be effected on the substrate through orifices in a mask which is preferably applied elastically against the substrate;

a plurality of thin semi-conductive coatings alternately positively and negatively doped may be deposited successively on the substrate.

DESCRIPTION OF PREFERRED EMBODIMENTS

Figure 1:
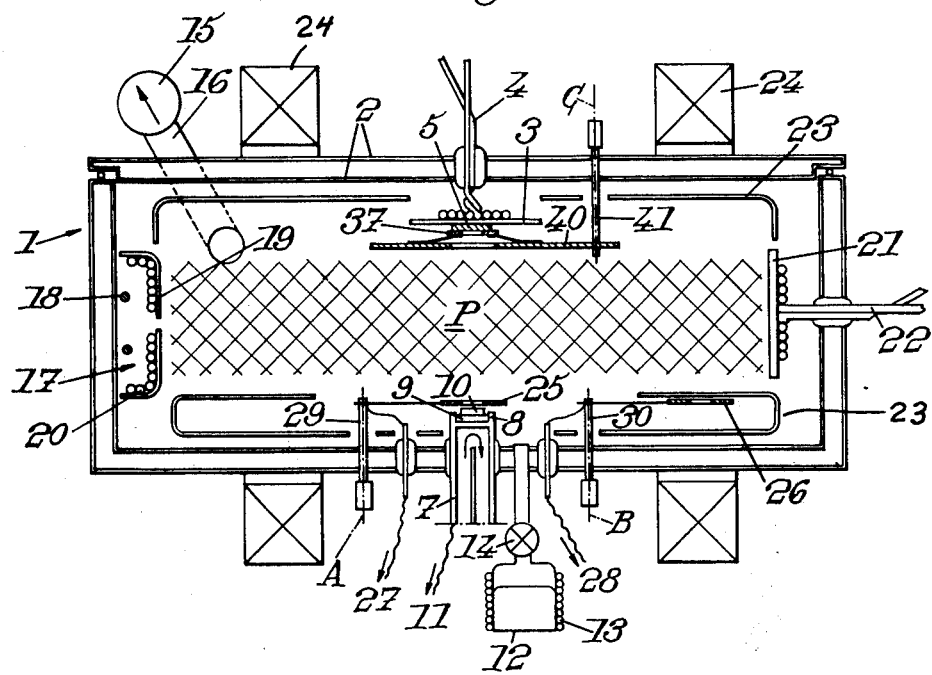
FIG. 1 is a diagrammatic vertical section through an apparatus for producing thin doped coatings.

Referring to the drawings, an embodiment of an apparatus for producing thin coatings comprises a vacuum enclosure 1 formed by a jacketed housing 2 between whose walls water or other coolant is circulated (by means not shown) the circulation making it possible at the same time to cool the contents of the enclosure, so as to maintain it at a constant temperature and pressure throughout performance of the method.

Within the enclosure are disposed an upper support 3 suspended from the top walls of the enclosure and equipped with heating or cooling means 4; a substrate 5 mounted on and below the support 3, on which substrate it is desired to deposit at least one thin doped semi-conductive coating 6 (see FIG. 4); and a lower support 7 (FIGS. 1, 2 and 3) of material which conducts heat and electricity, of which the upper part is in the form of a cup 8 which contains a piece 10 of semi-conductive alloy constituting the main source or "target," to which heat and electric current is conducted by mercury 9, although another conductive liquid could be used. Also provided are means 11 for bringing the support 7 to a negative electrical potential and means for generating an ionic plasma P within the enclosure. The plasma generating means may be constituted in any desired manner, and may in particular operate at radio frequency. In the present embodiment illustrated, the plasma generating means provides for flow into the enclosure 1 of a stream of mercury vapour at reduced pressure, and includes means for emitting electrons into the vapour, to ionise it and to form the plasma P, and means for confining the plasma.

In more detail the plasma generating means has a reservoir of mercury 12 heated by a winding 13 and communicating with the enclosure 1 by a regulatable escape valve 14, the vacuum in the enclosure being created by a mercury diffusion pump 15 having a liquid nitrogen trap and connected to the enclosure 1 by a duct 16. Also the plasma generating means has an electron gun 17 with two tungsten filaments 18, a screen 19 cooled by circulation of water 20 so as to condense the evaporated tungsten and thus avoid contamination of the enclosure, a starting electrode (not shown) and an anode 21, disposed at the end of the enclosure opposite the gun 17, and cooled by circulation of water 22. Finally the plasma generating means includes an assembly of screens 23 of floating potential so as to confine the plasma, and also external magnetic coils 24 for controlling concentration and homogeneity of the plasma.

By use of this apparatus it is possible to deposit, and to cause epitaxial growth on the substrate 5, thin coatings of atoms taken from the target 10 by the plasma ions.

Hitherto, "doping" of thin semi-conductive coatings formed by metallic impurities capable of imparting to them a type n or type p conduction has been carried out independently of the formation of the coatings, such as by thermal diffusion of the impurities into the coatings formed. In the method of the present invention the formation process itself is used to deposit and cause to grow on the substrate a thin coating comprising both the semi-conductor system and metallic doping impurities incorporated into it.

For this purpose, there is introduced into the enclosure at least one second or "auxiliary target," constituted by the desired doping metal, in such a position that the auxiliary target is, or may be, like the target 10, exposed to the plasma and connected to a source of electric current. This method achieves homogeneous doping and a high rate of doping.

In the embodiment illustrated two auxiliary targets 25 and 26 are used, connected respectively to two current sources 27 and 28, preferably regulatable. One target provides for negative doping of the semi-conductor substance of the target 10, by adding to its system impurities of the "donor" type, and the other positively dopes the substance of the target 10 by adding impurities of the "acceptor" type. It is desirable that the two auxiliary targets operate in turn and not simultaneously, so that the dopings are not self-cancelling.

Means are thus provided for neutralising one when the other is operating, and vice versa. Two embodiments of such means are shown, the first using mechanical and electrical neutralisation, the second purely electrical neutralisation.

Figure 2:
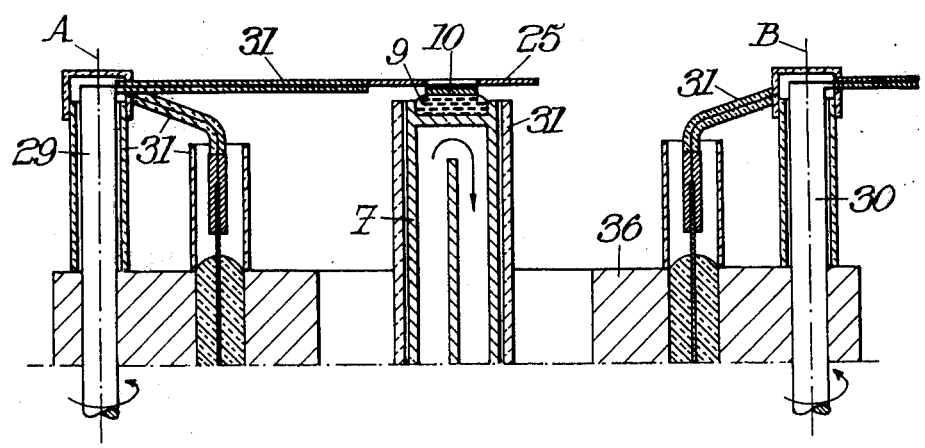

In the first embodiment, illustrated in FIGS. 1 and 2, each auxiliary target 25, 26 is mounted so as to pivot about a respective vertical axis A, B on a shaft 29, 30 passing through the lower walls of the enclosure by means of a sealed joint. Each auxiliary target is offset from the respective vertical axis so that, by simle rotation of the shaft, the target 25 or 26 can move from a first position in which it is exposed to the plasma P, as is the case for target 25 in FIGS. 1 and 2, to a second position in which it is isolated from the plasma, and is for this purpose shielded within a cavity formed by one of the screens 23, as is the case for the target 26 in FIG. 1.

Each target 25, 26 is in the form of a fixed flat washer with a central aperture of vertical axis and mounted so that it surrounds the top of the main target 10 when in the exposed position, the axial distance between the two targets 10 and 25 or 10 and 26, which are then coaxial, being adjustable, preferably once and for all, by adjustment of the axial position of the shaft 29 or 30.

All the surfaces of the mountings and current lead-ins which are not used for atomisation or volatilisation are masked by glass indicated at 31.

Figure 3:
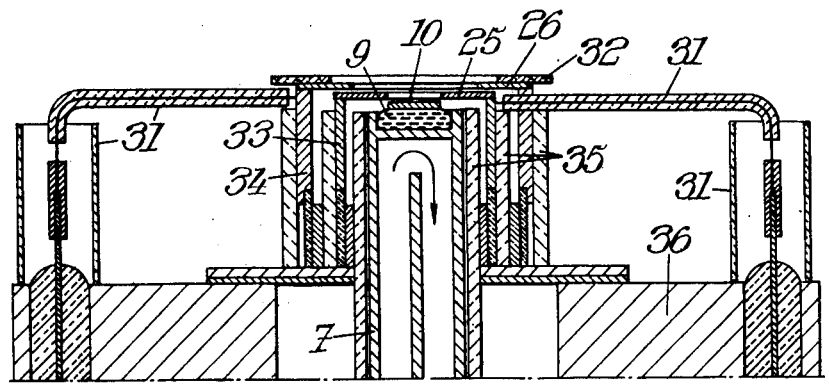
FIGS. 2 and 3 are diagrammatic enlarged vertical sections showing two details of the apparatus of FIG. 1.

In the embodiment of FIG. 3, the two auxiliary targets 25, 26 are again flat washers each with a central aperture of vertical axis, but they are fixed and both coaxial with the main target 10, being disposed in effect in successive annular steps. The aperture of the lower target 25 is of smaller diameter than that of the upper target 26, and the latter is peripherally covered by a mica washer 32 having a still larger central aperture, as shown in FIG. 3. The diameters of the apertures in the auxiliary targets and washer 31 define the surfaces of the three targets exposed to the plasma P, the areas of the surfaces being linked to the rates of doping.

Each auxiliary target is supported on a respective cylinder 33, 34 of stainless steel, a material with which mercury is not likely to form an amalgam, and the concentric cylinders 33, 34 are insulated from one another and from the central support 7 by glass cylinders 35. The axial distances between the consecutive targets 10, 25 and 26 are for example of the order of half a millimeter. The current lead-ins and generally those surface areas not used for atomisation are masked by glass as indicated at 31.

It will also be seen from FIGS. 2 and 3 that there is a base plate 36 preferably of stainless steel.

Figure 4:
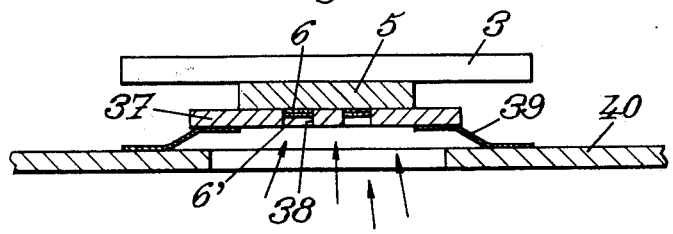
FIG. 4 is a diagrammatic section of an alternative embodiment.

Referring to FIGS. 1 and 4, a mask 37 limits as desired to localised areas those zones of the substrate 5 on which the thin coating is to be deposited. A set of such masks may be provided, making it possible at will to wholly isolate the substrate 5 from the plasma P or partially or completely to expose it. In the case of the perforated mask, the edges of the perforations may be applied closely against the surface to be coated in order clearly to define the contours of the portions of thin coating deposited. This is particularly desirable in the case of "mosaic" type deposits. For this purpose, the mask 37, perforated at 38, is mounted by a flexible structure 39 on a frame 40 which is itself mounted on a rotary shaft 41 (FIG. 1) of vertical axis C which shaft passes through the walls of the enclosure via a sealing joint. The frame 40 itself carries the mask and the other partial masks if provided. The flexible structure 39 may be constituted by a set of three or four flexible radiating blade-like members.

The shaft 41, like the shafts 29 and 30, may be rotated by hand or by driven means.

By way of example, there will now be described one method of producing thin doped semi-conductor coatings using the above-described apparatus.

The substrate 5 is a semi-conductor crystalline plate of silicon or an alloy $Cd_xHg_{1-x}Te$, a formula in which $x$ is a number between 0 and 1 and preferably between 0.15 and 0.35, for example 0.20 for infra-red detectors.

The substrate 5 is heated to a temperature of from 50° to 300° C and is polarised to a weak positive potential.

The plasma P is a mercury plasma as disclosed above, under a pressure of $10^{-3}$ mm Hg.

The main target 10 is a lozenge of 6 mm. diameter and is of a semi-conductor alloy $Cd_yHg_{1-y}Te$, in which $y$ is a number of the same definition as $x$, and it is polarised to a voltage between −500 and −1000 V. This target is disposed 5 cms. below the substrate 5.

The anode 21 is at +50 V and the discharge current is 5A. The magnetic field generated by the coil 24 is of the order of 100 G.

The first auxiliary target 25, for n type doping, is of aluminium, indium, or gallium or an alloy thereof and is polarised at a voltage between −5 and −200 V (for aluminium).

The second auxiliary target 26, for p type doping, is of gold, or copper, or silver, or an alloy of these metals and is polarised at a voltage between −1 and −12 V (for gold).

These voltages are indicated with respect to earth and not with respect to the plasma which is itself at +30 or +40 V with respect to earth.

To operate the apparatus and carry out the method, the various pumping elements and thermal and magnetic regulating systems are set in operation and the following items are electrically energised: the main target 10, the electron gun 17, the anode 21, possibly the substrate 5 and one of the two auxiliary targets, for example the target 25.

Care is taken not to energise the other auxiliary target 26, which is then automatically brought to the floating potential of the plasma, like the screens 23. A slightly positive potential may even be applied to the target 26.

The rate of volatilisation of the target 26 is then very low, even if it is fixed and remains exposed to the plasma as in FIG. 3. But this phenomenon is not troublesome because an amalgam progressively forms on the surface of the target 26, virtually preventing its volatilisation after 15 to 20 minutes.

During this preparatory phase, the substrate 5 is completely masked and the first target 25 is energetically polarised (for example by bringing its potential to −350 V if it is an aluminium target or to −150 V if it is a gold target), which cleans the target by strong ionic attack, rendering it capable of volatilising during the subsequent doping phase.

Then the shaft 41 is rotated to unmask those areas of the substrate 5 which it is desired to coat with a thin doped coating, which is then progressively deposited at a rate of about 1 micron of thickness per hour.

When the thin doped coating 6 thus deposited reaches the desired thickness, generally between 0.5 and 5 microns, the shaft 41 is again rotated to mask completely the substrate which is covered with the coating; then the auxiliary targets 25 and 26 are interchanged, either simply by changing their polarities (FIG. 3), or by rotating the shafts 29 and 30 (FIGS. 1 and 2) so that the target 25 is in its cavity, the target 26 being around the top of the main target 10.

Then, if necessary after a further preparatory phase, the areas of the coating 6 and/or of the substrate 5 on which it is desired to deposit a second thin coating 6' doped opposite to the first, are again exposed.

Plates, thus coated with two semi-conductor coatings doped in opposite directions, can form p-n or n-p junctions. Once cut, the plates can provide a plurality of semi-conductor elements of required sizes and of like characteristics. Each element may then be treated as required to constitute a usable semi-conductor device, for example by applying electrical connections to supply the two coatings and the substrate.

The devices thus produced may be used for sensitive detection of infra-red rays.

The thin coatings produced have good intrinsic qualities, both physical and electrical; in particular, their rate of doping may be determined with considerable accuracy by acting upon the polarisation voltages of the auxiliary targets; these rates may be relatively high and attain a few tenths percent or even a few units percent, which may correspond to "over-dopings," without the coatings which are thus "over-doped" with impurities being assimilated into alloys. Thus, in the above example, it is possible to obtain, with a polarisation voltage of −10 V, a gold concentration of 0.5% en masse, corresponding to $10^{20}$ atoms/cu.cm, a concentration which is higher than the maximum value (of the order of 0.1%) corresponding to the solubility limit of gold introduced by thermal diffusion into the semi-conductor; likewise, with a polarisation voltage of −150 V, it is possible to obtain a concentration of unused aluminium of 0.07% en masse, corresponding also to $10^{20}$ atoms/cu.cm.

Further, the above-described "co-atomisation" method makes it possible to produce junctions directly "in situ," and not by diffusion from the surface which yields poorly-defined junctions and leaves traces in the coatings traversed. Also the method of the invention lends itself to the production of coatings spread over large surface areas.

It is possible thus to prepare interesting photodiodes for detection of infra-red rays (whose wavelengths are generally between 2 and 14 microns) which diodes are useful in infra-red printing.

By way of example, it is possible to produce a detector sensitive to infra-red radiation of a wavelength of 10.6 microns, the specific detectivity of which is $5.10^{10}$ cm × $Hz^{1/2}$ × $W^{-1}$, the quantum yield of which is close to 60% and the response frequency of which is a few gigahertz, for a sensitive surface area of the order of $5.10^3$ microns and for an angle of view of 40°, the detector being maintained at the temperature of liquid nitrogen, that is to say 77° K.

The substrate 5 may itself have been previously doped either positively or negatively, or there may have been previously incorporated therein elements for storage or amplification of electrical signals, elements which can then be connected as required to the thin coatings or to other components of an electrical circuit equipped with the coatings.

It is also possible to produce on the substrate, covered with at least one doped coating, a mosaic of detector elements, which may or may not be identical, by chemical etching photogravure, as is known in the technique of producing semi-conductors of the "mesa" or "planar" type: the application of this technique is interesting within the framework of the invention, which makes it possible to obtain large-area junctions.

It is also possible to deposit the second coating 6' on a part only of the first coating 6, the masks used respectively in the two corresponding stages being separate or staggered.

It is also possible, by using the method of deposition and epitaxial growth described above, to produce transistors or phototransistors of the double p-n-p or n-p-n junction type, or more complex structures of the p-n-p-n or n-p-n-p type, produced by controlled and accurately localised deposits of successive thin semi-conductor coatings which are alternately positively and negatively doped.

The invention is not limited to the embodiments described above. Thus the auxiliary targets may have forms and/or positions other than those described, provided they are in the vacuum enclosure and that they can be, at least momentarily, exposed to the plasma. The substances constituting the semi-conductor, the plasma and the doping impurities may be different from those mentioned above, it being possible for example for the semi-conductor to consist of cadmium telluride, zinc telluride or other II–VI compound if the plasma is of argon; or of gallium nitride or indium nitride if the plasma is of nitrogen; or of cadmium sluphide if the plasma is of $SH_2$; of of indium oxide or tin (in which case the impurity may then be antimony), if the plasma is of oxygen.

We claim:

1. A process for making a semi-conductor device having a p-n or n-p junction by a method comprising the steps of forming a first doped layer by sputter depositing on a substrate in a vacuum enclosure containing a lowpressure ionic plasma, a semi-conductor substance of an alloy $Cd_x Hg_{1-x} Te$ where x is a number between 0 and 1, volatilized from a source or target first comprising $Cd_xHg_{1-x} Te$ in the enclosure, and co-sputter depositing an n-type metallic doping impurity from the group consisting of aluminum, indium and gallium, volatilized from a second source or target in the enclosure; and forming a second doped layer on said first doped layer by co-sputter depositing $Cd_xHg_{1-x} Te$, volatilized from said first source, and a p-type metallic doping impurity from the group consisting of gold, copper and silver, volatilized from a third source or target in the enclosure.

2. The process of claim 1, where $x$ is 0, the semi-conductor being Hg Te.

3. The process of claim 1, where $x$ is 1, the semi-conductor being Cd Te.

* * * * *